Jan. 1, 1963 J. E. THOMPSON ET AL 3,071,698
RAPID DISCHARGING OF CHARGED CAPACITOR THROUGH TRIGGERED
HYPERCONDUCTIVE (FOUR-LAYER) DIODE IN COMPUTER CIRCUIT
Filed Sept. 17, 1958

WITNESSES
John E. Healy, Jr.
Myron E. Click

INVENTORS
James E. Thompson &
James L. Van Meter
BY F. E. Browder
ATTORNEY

United States Patent Office 3,071,698
Patented Jan. 1, 1963

3,071,698

RAPID DISCHARGING OF CHARGED CAPACITOR THROUGH TRIGGERED HYPERCONDUCTIVE (FOUR-LAYER) DIODE IN COMPUTER CIRCUIT

James E. Thompson, Glen Burnie, and James L. Van Meter, Baltimore, Md., assignors to Westinghouse Electric Corporation, East Pittsburgh, Pa., a corporation of Pennsylvania Filed Sept. 17, 1958, Ser. No. 761,499
2 Claims. (Cl. 307—88.5)

This invention relates to computing circuits in general and particularly to switching circuits utilized in computers for storing information bits in electronic devices, such as magnetic drums.

The advent of a semiconductor diode having such characteristics that on exceeding certain specified reversed current and voltage the diode becomes highly conductive and thereafter will carry a substantial reverse current at low voltages, has led to many new electronic applications. The phenomenon described above is not a Zener breakdown, nor is it an avalanche breakdown. This unique breakdown characteristic can be repeated indefinitely. This breakdown has been designated as a hyperconductive breakdown, and a diode having such characteristics will be referred to hereinafter as a hyperconductive diode.

An example of such a hyperconductive diode with a controllable reversible breakdown characteristic or hyperconductive breakdown may be constructed from the following elements. A first base element consists of a semiconductor member doped with an impurity to provide a first type of semiconductivity, either N or P. Upon this first base is an emitter consisting of semiconductor material doped with the opposite type of semiconductivity. This emitter may be prepared by alloying a pellet containing a doped impurity to a wafer of semiconductor material forming the first base. An emitter junction is present at the zone between the first base and the emitter.

In order to facilitate the connecting of the diode and to an electrical circuit, a layer of silver or other good conductor metal may be fused, alloyed into, or soldered with the upper surface of the emitter. Copper lead wires may be readily soldered to this layer.

A second base of opposite conductivity is provided next to the first base. A zone where the first and second bases meet forms a collector junction.

Next to the second base is a mass-of-metal which is a source of carriers that play a critical part in the functioning of the hyperconductive diode. This mass-of-metal may be neutral or it may have the same doping characteristics as the second base. The mass-of-metal may be applied to the second base by a soldering, alloying, fusing or other similar well-known method.

Such a hyperconductive semiconductor diode is described in a copending application Serial No. 642,743, entitled "Semiconductor Diode," filed February 27, 1957, Patent No. 2,953,693, and assigned to the same assignee as the present invention. For a more detailed description of the construction, characteristics and operation of such a hyperconductive diode, reference is made to the above copending application, Serial No. 642,743.

A further example of a hyperconductive diode having the characteristics as described in this specification may be found by having reference to an article, entitled "The Four-Layer Diode," by Dr. William Shockley, in Electronics Industries and Tele Tech, August 1957, pages 58 to 60, 161 to 165.

It is an object of this invention to provide improved computer circuitry.

It is another object of this invention to provide improved computer circuitry which is immediately compatible with transistor elements, provides minimum power drain, and is a small control element capable of delivering large "write currents" to storage elements in computer circuits.

It is still another object of this invention to provide a circuit which utilizes the switching action of a hyperconductive diode to discharge a capacitive element through a "read-write" circuit which allows a larger pulse of current to flow for a short period of time.

Further objects of this invention will become apparent from the following description when taken in conjunction with the accompanying drawing. In said drawing, for illustrative purposes only, there is shown a preferred embodiment of the invention.

Figures 1, 2, 3:
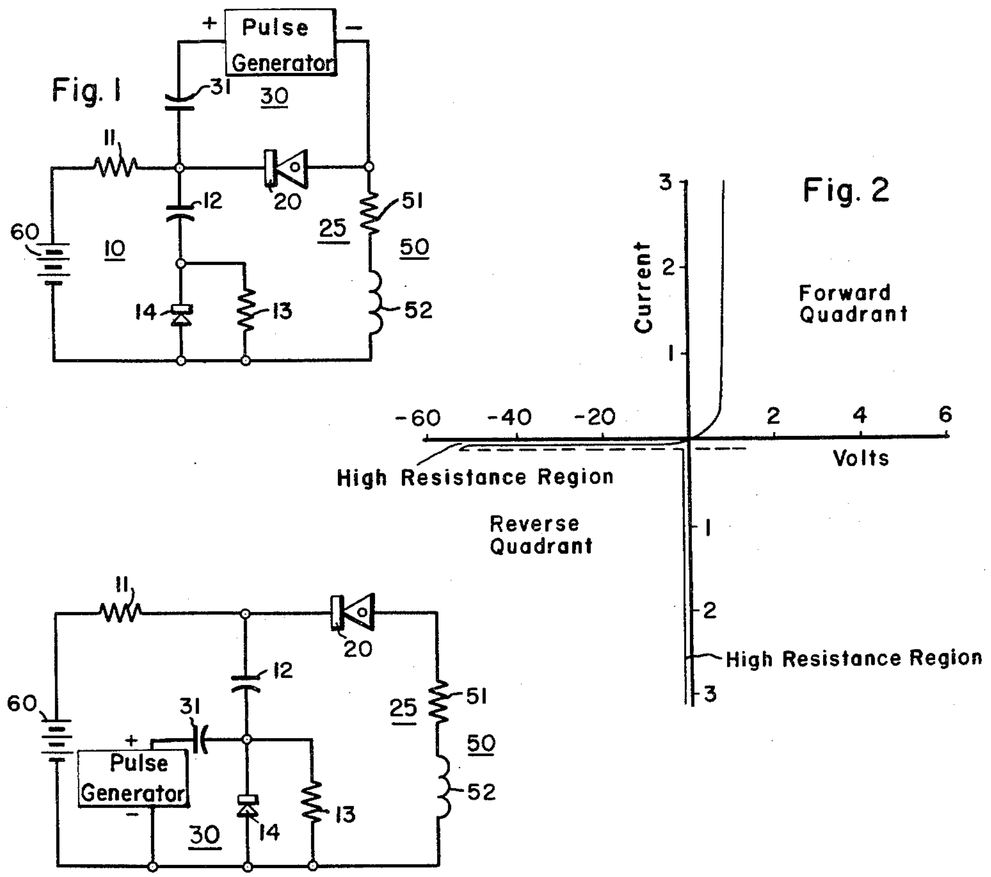
FIG. 1 is a schematic diagram illustrating a preferred embodiment of the computer circuitry of this invention.
FIG. 2 is a graphical representation of a characteristic of the hyperconductive diode to be utilized herein.
FIG. 3 is a schematic diagram of a second embodiment of the teachings of this invention.

Referring to FIG. 1, there is illustrated an energy storage network 10 connected across a source of direct current supply voltage 60. A hyperconductive diode 20 and a load 50 are serially connected in a "write" circuit 25 across the output of the energy storage circuit 10. A "start-write" input circuit 30 is connected across the hyperconductive diode 20. The load 50 comprises a resistor 51 representing the ohmic resistance of the load 50 and an inductance 52 representing the reactance of the load 50. The load 50 may be, for example, a magnetic drum "read-write" head commonly used by and known to those skilled in the art. The energy storage network 10 comprises a charging resistor 11, a capacitor means 12 and a charging resistance 13 connected in series-circuit relationship across the supply voltage 60. The output of the charge network 10 is taken from across the capacitor 12.

Referring now to FIG. 2, the graphical representation shows how the hyperconductive semiconductor diode responds to the application of different voltages. Considering the upper right or forward quadrant, when a forward voltage of the order of one voltage unit is applied, a current builds up to approximately three current units. When the voltage is reversed, it builds up in the reverse direction to about 55 voltage units with only a small fraction of current unit flowing, and then the diode suddenly becomes highly conductive or hyperconductive, and the voltage drops to about one voltage unit, as shown in the lower left or reverse quadrant. Thus, the hyperconductive diode becomes a conductor with low ohmic resistance in the reverse direction, and the current builds up rapidly to several current units.

As shown in the reverse quadrant when the hyperconductive diode breaks down, the voltage drops along a substantially straight line to approximately one voltage unit, and very little power is dissipated in maintaining the hyperconductive diode highly conductive in the reverse direction. The hyperconductive diode can be rendered highly resistant again by reducing the current below a minimum threshold value and the voltage below breakdown value. Consequently, the curve can be repeatedly followed as desired by properly controlling the magnitude of the reverse current and voltage.

The breakdown or the process of the diode becoming hyperconductive in the reverse direction occurs within a small interval of time. Investigations have revealed that from the time of subjecting the diode to the necessary voltage in the reverse direction to render it highly conductive to the time when it sustains relatively high current at a low reverse voltage, comprises an interval of the order of $\frac{1}{10}$ of a microsecond in this particular investigation. Further, it has been found that the breakdown of the hyperconductive diode in the reverse direction will respond to currents of a very wide range of frequencies, of the order of 1 megacycle.

Referring again to FIG. 1, the operation of the apparatus will now be described. In the time or period immediately before signaling the circuit of FIG. 1 to "write" into the computer storage element, the capacitor 12 will be fully charged through the resistors 11 and 13 from the supply voltage 60 to a voltage near the breakdown voltage of the hyperconductive diode 20. A "start-write" pulse, with polarity as shown in FIG. 1, is applied through the capacitor 31 of the "start-write" circuit 30 which, in combination with the voltage already charged on the capacitor 12, will break down the hyperconductive diode 20, causing it to conduct in the reverse direction. The capacitor 12 is then discharged fully through the load 50 giving a large pulse of current to the load 50 in a short period of time.

The rectifier 14 connected in series with the capacitor 12 across the "write" circuit 25 including the hyperconductive diode 20 and the load 50 insures that the "start-write" pulse $E_1$ is not bypassed by the capacitor 12. The rectifier 14 also provides a lower impedance discharge return path for the capacitor 12 by being connected in shunt relationship with the resistor 13.

Ideally, the parameters of the inductance 52, the resistance 51, and the capacitance 12 would be adjusted such as to allow one-half of a sine wave of current to flow in a time equal to the desired time of the "write" pulse through the load 50. At the end of the "write" pulse, the capacitor 12 will have a negative charge on it, but the rectifier 14 prevents large current flow in the opposite direction. The capacitor 12 charges up again through the resistance 11 and 13 to become ready for the next "start-write" pulse $E_1$.

Figure 4:
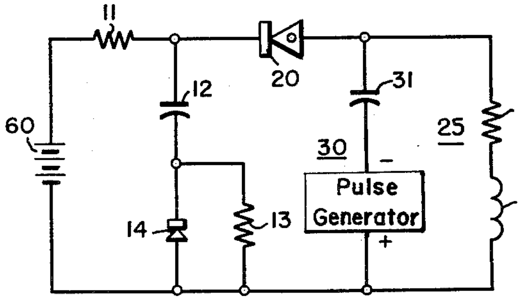
FIG. 4 is a schematic diagram of a third embodiment of the teachings of this invention.

It should be noted that the "start-write" pulse $E_1$ need not be applied directly across the hyperconductive diode 20 as shown in FIG. 1 but may also be applied in other manners, for example, as shown in FIGS. 3 and 4. In FIG. 3 the "start-write" circuit 30 is connected across the rectifier 14 but is still effectively across the hyperconductive diode 20 to cause reverse breakdown thereof. In FIG. 4 the "start-write" circuit is connected across the load 50 but is still effectively across the hyperconductive diode 20 to cause reverse breakdown thereof.

It is readily recognized that the circuitry described utilizes very little power from the "start-write" pulse $E_1$ and the peak power required from the power source 60 is considerably reduced allowing the use of transistorized circuitry throughout the associated network. The power supply 60, although represented as a direct current battery-type supply, may be any suitable direct-current source which will properly charge the capacitor 12 between the application of the "start-write" pulse $E_1$.

A "hyperconductive diode" as set forth in the claims is meant to define a semiconductor device which remains in a relatively high resistance state until the voltage across the device exceeds a predetermined value whereupon the device has a negative resistance characteristic followed by a relatively low resistance or hyperconductive state. The device will return from the relatively low resistance state to the relatively high resistance state when the current through the device is reduced below a predetermined value.

In conclusion, it is pointed out that while the illustrated example constitutes a practical embodiment of our invention, we do not limit ourselves to the exact details shown, since modification of the same may be varied without departing from the spirit and scope of this invention.

We claim as our invention:

1. In a computer circuit for providing a write pulse to a load for a predetermined period of time in response to being actuated by a start write pulse, the combination of: energy storage circuit means including a diode, a resistor connected in parallel with said diode and a capacitor connected in series with said diode and said resistor; a unidirectional voltage source connected across said storage circuit means and being operative to charge said capacitor; write circuit means connected in series with said storage circuit means, said write circuit means including a load impedance having a resistive and an inductive component, and a hyperconductive diode connected in series with said load impedance; and start write circuit means operatively connected to said hyperconductive diode, and being operative to selectively apply a start write pulse to said hyperconductive diode in order to break down said hyperconductive diode and discharge said capacitor therethrough to provide a write pulse to said load impedance.

2. In a computer circuit for providing a write pulse to a load for a predetermined period of time in response to being actuated by a start write pulse, the combination of: energy storage circuit means including a diode, a resistor connected in parallel with said diode and a capacitor connected in series with said diode and said resistor; a unidirectional voltage source connected across said storage circuit means and being operative to charge said capacitor; a write circuit means connected in series with said storage circuit means, said write circuit means including a load impedance having a resistive and an inductive reactive component, and a hyperconductive diode connected in series with said load impedance; and start write circuit means operatively connected to said hyperconductive diode, and being operative to selectively apply a start write pulse to said hyperconductive diode in order to break down said hyperconductive diode to discharge said capacitor therethrough to provide a write pulse to said load impedance, with said resistive and inductive components of said load impedance and said capacitor being so chosen to allow one half of a cycle of current to flow in said write circuit in a predetermined time desired for said write pulse.

References Cited in the file of this patent

UNITED STATES PATENTS

| | | |
|---|---|---|
| 2,565,497 | Harling | Aug. 28, 1951 |
| 2,647,995 | Dickinson | Aug. 4, 1953 |
| 2,797,327 | Kidd | June 25, 1957 |
| 2,837,663 | Waltz | June 3, 1958 |
| 2,910,641 | Boyer | Oct. 27, 1959 |
| 2,917,698 | Petrocelli | Dec. 15, 1959 |
| 2,944,164 | Odell | July 5, 1960 |
| 2,949,544 | Hill | Aug. 16, 1960 |

FOREIGN PATENTS

| | | |
|---|---|---|
| 166,800 | Australia | Feb. 6, 1956 |

OTHER REFERENCES

Shockley: "The Four-Layer Diode," Electronics Industries, August 1957, pages 58 to 61, 161 to 165.

Electronics, February 1946 (Cornelius), pages 118–123.